US008796903B2

(12) United States Patent
Furuya et al.

(10) Patent No.: US 8,796,903 B2
(45) Date of Patent: Aug. 5, 2014

(54) PIEZOELECTRIC VIBRATOR DRIVING CIRCUIT

(75) Inventors: Misao Furuya, Nagano (JP); Hirohiko Yoshioka, Nagano (JP); Daisuke Takahata, Saitama (JP); Fumiaki Honda, Saitama (JP); Kazuyuki Ueda, Saitama (JP)

(73) Assignee: Fukoku Co., Ltd., Saitama (JP)

( * ) Notice: Subject to any disclaimer, the term of this patent is extended or adjusted under 35 U.S.C. 154(b) by 272 days.

(21) Appl. No.: 13/303,699

(22) Filed: Nov. 23, 2011

(65) Prior Publication Data

US 2012/0133307 A1    May 31, 2012

(30) Foreign Application Priority Data

Nov. 26, 2010    (JP) ................................. 2010-264042

(51) Int. Cl.
*H02N 2/06* (2006.01)
(52) U.S. Cl.
USPC ......................................................... 310/317
(58) Field of Classification Search
USPC ................................................. 310/314, 317
See application file for complete search history.

(56) References Cited

U.S. PATENT DOCUMENTS 5,675,296 A * 10/1997 Tomikawa .................... 331/158
2005/0104475 A1* 5/2005 Kataoka ........................ 310/317

FOREIGN PATENT DOCUMENTS

| JP | 01-293170 A | 11/1989 |
| JP | 05-023646 A | 2/1993 |
| JP | 05-212331 A | 8/1993 |
| JP | 06-063507 A | 3/1994 |

* cited by examiner

*Primary Examiner* — Derek Rosenau
(74) *Attorney, Agent, or Firm* — Arent Fox LLP

(57) ABSTRACT

One embodiment provides a piezoelectric vibrator driving circuit for driving a piezoelectric vibrator, the piezoelectric vibrator having an equivalent circuit in which an LC series resonance circuit, an equivalent resistor Rx connected in series thereto and a damping capacitor Co connected in parallel to them are provided, the driving circuit is configured: to detect a driving current Iz flowing through the entire piezoelectric vibrator; to detect a damping current Iy flowing through the damping capacitor Co; to calculate a series resonance current Ix flowing through the LC series resonance circuit by subtracting the detected damping current Iy from the detected driving current Iz; and to perform a phase adjustment so that a phase difference between the calculated series resonance current Ix and a driving voltage Ve to be applied to the piezoelectric vibrator becomes approximately 0.

11 Claims, 10 Drawing Sheets

PIEZOELECTRIC VIBRATOR DRIVING CIRCUIT

CROSS-REFERENCE TO RELATED APPLICATION(S)

This application claims priority from Japanese Patent Application No. 2010-264042 filed on Nov. 26, 2010, the entire contents of which are incorporated herein by reference.

FIELD

The present invention relates to a piezoelectric vibrator driving circuit for a device that utilizes mechanical vibrations of a piezoelectric vibrator. The present invention may be utilized for various devices, and its application range is not limited to any particular device. As an example, a case where the present invention is utilized for a portable atomizer (spray device) for atomizing (spraying) liquid in the form of mist will be described.

BACKGROUND

An atomizer that utilizes a piezoelectric vibrator has conventionally bee for many purposes. Sometimes, an atomizer is desired to be portable. In a portable atomizer, since a battery is used as a power supply, low power consumption is required in addition to usability.

Further, since such portable atomizer tends to be used with various situations (postures/positions), a load applied to a piezoelectric vibrator will be frequently changed. Therefore, it is preferable to provide a measure for maintaining vibrations of the piezoelectric vibrator constant with respect to a varying load. And, it is also preferable to provide a measure for absorbing individual variations in vibrator resonance frequency, load resistance, etc. in mass production.

Moreover, in such portable device, size reduction may also be a challenge. Thus, it is preferable to simultaneously archive size reduction of a battery through the reduction in the power consumption, size reduction of components and reduction in the number of components. For example, while a boosting section for obtaining a high voltage for driving of a piezoelectric vibrator is needed, when a DC-DC converter or a transformer is used as in a conventional technique, a large component will be necessary, and power loss is caused in a boosting section. Thus, it is also preferable that a piezoelectric vibrator is driven by the lowest possible boosted voltage and that a boosting circuit is simplified as much as possible while maintaining a high overall system efficiency.

Generally, driving modes for a piezoelectric vibrator are divided into a forced driving system (separate excitation system) and a self-excitation vibration system. In the forced driving system, an external signal is applied to a piezoelectric vibrator to forcedly drive the piezoelectric vibrator. In this system, although activation is fast and usability is high, a frequency of the external signal is not directly relevant to a resonance frequency of the piezoelectric vibrator, and therefore, power required for driving tends to increase. Thus, the forced driving system unsuitable may not be suitable for a portable device.

In the self-excitation vibration system, an oscillation circuit in which a piezoelectric vibrator is used as a resonator is formed. The piezoelectric vibrator is vibrated by its resonance frequency. While this system is advantageous that loss is small and a reduction in power consumption is enabled, takes time for the piezoelectric vibrator to be sufficiently vibrated. Thus, the self-excitation vibration system is disadvantageous in usability.

Therefore, there is proposed an alternative system (feedback system) which is basically a forced driving system having a self-excitation oscillator but is provided with a feedback circuit so that an oscillation frequency of the self-excitation oscillator becomes a resonance frequency of the piezoelectric vibrator.

JP-H01-293170-A, JP-H05-023646-A, JP-H05-212331-A and JP-H06-063507-A each disclose a technique related to the feedback system for allowing a driving frequency to follow "resonance frequency" of a piezoelectric vibrator. Note that, in these techniques, the "resonance frequency" does not mean the resonance frequency of an LC series resonance circuit of the piezoelectric vibrator, but means the resonance frequency of the entire piezoelectric vibrator, including a damping capacitor. These techniques are broadly classified into:

TECHNIQUE 1 in which a driving frequency is controlled so that a current flowing through an entire piezoelectric vibrator is maximized; and TECHNIQUE 2 in which a driving frequency is controlled so that a phase of a current flowing through an entire piezoelectric vibrator and that of a driving voltage coincide with each other.

FIG. 2 illustrates an equivalent circuit Sx' of a piezoelectric vibrator Sx. As illustrated in the equivalent circuit Sx' in FIG. 2, the piezoelectric vibrator Sx is represented as the equivalent circuit Sx' configured so that a damping capacitor Cc is connected in parallel to a series circuit of an equivalent capacitor Cx, an equivalent inductor Lx and an equivalent resistor Rx. The series circuit of the equivalent capacitor Cx, the equivalent inductor Lx and the equivalent resistor Rx forms an LC series resonance circuit. When the piezoelectric vibrator is vibrated to cause atomization of liquid, a mechanical load is applied to the piezoelectric vibrator, and the applied load is represented as a increase in the value of the equivalent resistor Rx in the equivalent circuit Sx'.

FIGS. 5A and 5B each illustrates frequency characteristics obtained when a driving voltage Ve is applied to the equivalent circuit illustrated in FIG. 2. A current flowing through the LC series resonance circuit is represented by Ix and will hereinafter be referred to as a "series resonance current Ix", a current flowing through the damping capacitor Co is represented by Iy and will hereinafter be referred to as a "damping current Iy", and a current flowing through the entire piezoelectric vibrator is represented by Iz and will hereinafter be referred to as a "driving current Iz", Px, Py and Pz represent phases of the respective currents with respect to the applied voltage. The phases are expressed in degrees and represented by the scale on the right side of the drawings.

FIG. 5A illustrates a case where the value of the equivalent resistor Rx is low, and FIG. 5B illustrates a case where the load is applied and the value of the equivalent resistor Rx is increased. In both of FIGS. 5A and 5B, the amplitude of the applied driving voltage Ve is the same, and the same current scale and the same phase scale are used.

A frequency fx is a series resonance frequency where the equivalent capacitor Cx and the equivalent inductor Lx are brought into a series resonance state, the resulting impedance becomes 0, and the series resonance current Ix flowing therethrough becomes completely resistive. Therefore, the resulting phase Px coincides with the phase of the driving voltage Ve, and maximum power is supplied to the equivalent resistor. Accordingly, a driving frequency will be adjusted to the series resonance frequency fx in order to supply the maximum power with respect to the load at the same driving voltage Ve. While the series resonance frequency fx depends on temperature, it does not change depending on the load.

In the state of FIG. 5A, in the above-mentioned TECHNIQUE 1, the piezoelectric vibrator is driven by a driving frequency fz1 by which the driving current Iz is maximized. On the other hand, in the above-mentioned TECHNIQUE 2, the piezoelectric vibrator is driven by a driving frequency fz2 by which the phase Pz of the driving current Iz with respect to the driving voltage Ve becomes 0. As understood from FIG. 5A, the driving frequencies fz1 and fz2 are both deviated from the series resonance frequency fx by which the series resonance current Ix is maximized.

In the state of FIG. 5B, in the above-mentioned TECHNIQUE 1, the driving frequency fz1 is obtained, but as understood from the comparison with FIG. 5A, a difference between the driving frequency fz1 and the series resonance frequency fx is increased. On the other hand, in the above-mentioned TECHNIQUE 2, there exists no frequency by which the phase Pz of the driving current Iz becomes 0, and therefore, the driving frequency is uncontrollable.

The above results are caused due to the fact the driving current Iz flowing through the piezoelectric vibrator is provided by a combination of the series resonance current Ix and the damping current Iy. The damping current Iy is capacitive and thus has a leading phase with respect to the driving voltage Ve, and therefore, the driving current Iz also has a leading phase with respect to the driving voltage Ve. Further, the frequency fz1 by which the driving current Iz is maximized is lower than the series resonance frequency fx.

And, when a load change occurs, the current flowing through the equivalent resistor Rx, i.e., the series resonance current Ix, is also changed, and the magnitude of the driving voltage Ve is changed in an actual circuit. Even when a control for making the magnitude of the driving voltage Ve or the current constant is performed, since such control is performed based on the driving current Iz (not the series resonance current Ix), effect due to a change in the series resonance current Ix depending on the load could not be eliminated.

SUMMARY

One object of the present invention is to provide a piezoelectric vibrator driving circuit suitable for a battery-driven device such as a portable device, and is capable of quickly starting, in an atomizer (spray device), far example, performing atomization (spraying operation) immediately after an activation operation and strongly/stably even when a boosted voltage is low.

In FIGS. 5A and 5B, it is impossible to directly detect the series resonance current Ix, and only the driving current Iz is detectable from outside. The driving current Iz is provided by a combination of the series resonance current Ix and the damping current Iy; hence, when the damping current Iy is known, the series resonance current Ix will be obtained by the expression: Iz−Iy.

FIG. 3 illustrates a circuit used for simulation of behavior of the piezoelectric vibrator. As a detector for detecting the driving current Iz flowing through the entire piezoelectric vibrator in accordance with an actual usage condition (load condition), a capacitor Cc is added. The equivalent circuit Sx' of the piezoelectric vibrator is connected in series to the capacitor Cc via a point L.

In FIG. 3, capacitors Ca and Cb are further provided. A series circuit of the capacitors Ca and Cb, which are connected via a point K, is connected in parallel to a series circuit of the piezoelectric vibrator equivalent circuit Sx' and the capacitor Cc. Relationships among the capacitors Ca, Cb, Cc and Co are set so as to satisfy the expression: Ca/Co=Cb/Cc (where Ca, Cb, Cc and Co denote values of the capacitors Ca, Cb, Cc and Co, respectively). A current Is flowing through the capacitors Ca and Cb imitates the damping current Iy flowing through the damping capacitor Co.

FIG. 5C illustrates simulation results when sinusoidal wave is added to the circuit illustrated in FIG. 3. The value of the equivalent resistor Rx is the same as that of the equivalent resistor Rx in FIG. 5B. In FIG. 5C, Vk and Vl represent voltages at the points K and L illustrated in FIG. 3, respectively, and Pk and Pl represent phases of Vk and Vl with respect to the applied voltage, respectively. Vlk represents a result obtained by subtracting Vk from Vl with their phases, and Plk represents a phase of Vlk.

Referring to FIG. 5C and FIG. 53, the waveform of VLK is approximately similar to that of Ix. The vertex of the waveform of Vlk coincides with that of Ix at the driving frequency fx. The phase Px of Ix is 0 degree at the driving frequency fx, but the phase Plk of Vlk is −90 degrees. This is because since the current flowing through the capacitor advances by 90 degrees with respect to the voltage, a delay of 90 degrees occurs when the current phase is detected based on the voltage phase. The voltage Vk at the point K is obtained just by dividing the driving voltage Ve by Ca and Cb, and therefore, the phase Pk of the voltage Vk is 0 degree.

When the waveform of the series resonance current Ix is obtainable in this manner, the phase of the series resonance current Ix is allowed to coincide with that of the driving voltage Ve, for example, by adding a phase shift circuit, thereby maximizing the supplied power to the equivalent resistor Rx while using the driving voltage Ve of the same magnitude.

Specifically, there are provided a driving current phase detection circuit for detecting the driving current Iz, including its phase, a damping current phase detection circuit for detecting the damping current Iy in a simulated manner, and a series resonance current calculation circuit far calculating the waveform of the series resonance current Ix from the outputs of these detection circuits, and a phase shift circuit for adjusting phases is further used, thereby performing control so that the phase of the driving voltage Ve and that of the series resonance current Ix coincide with each other.

Here, the oscillation frequency, i.e., the driving frequency fx, does not change at all times irrespective of a load change. In other words, as understood from the comparison between FIGS. 5A and 5B, the driving frequency fx does not change in both of the state illustrated in FIG. 5A in which no load is applied and the state illustrated in FIG. 5B in which a load is applied. Consequently, irrespective of a load change, continuous driving of the piezoelectric vibrator by maximum power is enabled at the frequency fx at all times.

According to one aspect of the present invention, there is provided a piezoelectric vibrator driving circuit for driving a piezoelectric vibrato; the piezoelectric vibrator having an equivalent circuit in which an LC series resonance circuit formed by an equivalent capacitor Cx and an equivalent inductor Lx connected in series, an equivalent resistor Rx connected in series to the LC series resonance circuit and a damping capacitor Co connected in parallel to the LC series resonance circuit and the equivalent resistor Rx are provided, the driving circuit including: a self-excited oscillation type oscillation circuit section configured to oscillate, an oscillation frequency thereof being variable; a driving pulse generator configured to generate a driving pulse in synchronization with the oscillation frequency; an output driver configured to output a driving voltage Ve to be applied on the piezoelectric vibrator, based on the driving pulse; a driving current phase detector configured to detect a driving current Iz flowing through the entire piezoelectric vibrator; a damping current phase detector configured to detect a damping current Iy flowing through the damping capacitor Co; a series resonance current calculator configured to subtract the detected damping current Iy from the detected driving current Iz to thereby calculate a series resonance current Ix flowing through the LC series resonance circuit; a synchronization section configured to synchronize the oscillation frequency of the oscillation circuit section with a frequency of the calculated series resonance current Ix; and a phase shift circuit section inserted into any point of a signal path leading from an output terminal of the driving current phase detector or the damping current phase detector to an input terminal of the output driver, and configured to perform a phase adjustment so that a phase difference between the calculated series resonance current Ix and the driving voltage Ve becomes approximately 0.

The piezoelectric vibrator driving circuit according to the present invention is capable of driving the piezoelectric vibrator at a frequency at which a phase difference between a current Ix flowing through the LC series resonance circuit of the piezoelectric vibrator and the driving voltage applied to the piezoelectric vibrator from the output driver becomes 0, i.e., at a resonance frequency of the LC series resonance circuit, thereby minimizing an impedance of the LC series resonance circuit, provide maximum vibration performance for a load at the same driving voltage, and keep a boosted voltage for driving at a low level.

When the output driver is provided with a timing booster, large components such as a DC-DC converter and a transformer for voltage boosting can be omitted. As a result, the power loss in these components is also avoided, and efficiency is improved on the whole.

When the voltage or current level signal, which corresponds to the vibration of the piezoelectric vibrator and should be maintained constant, is inputted to the PWM comparator via the error voltage amplifier, the driving condition of the piezoelectric vibrator is accurately controlled. When the output amplitude of the series resonance current calculator is controlled so as to be constant, the series resonance current, i.e., the current flowing through the load, can be kept constant, thereby precisely and stably controlling the vibration of the piezoelectric vibrator.

When the oscillation circuit section for outputting a triangular wave or a sawtooth wave is used and the triangular wave or sawtooth wave is utilized as a comparison signal of the PWM comparator, a circuit configuration for keeping the driving condition of the piezoelectric vibrator constant is simplified. The circuit configuration can also be simplified by replacing part of the whole circuit with a PLL.

According to the present invention, there is provided a small-size atomizer (spray device) capable of starting an atomization (spraying operation) immediately after an activation operation and performing it efficiently/stable with low power, and the present invention achieves remarkable effects in a battery-driven portable device in particular.

DETAILED DESCRIPTION

First Embodiment

Figure 1:
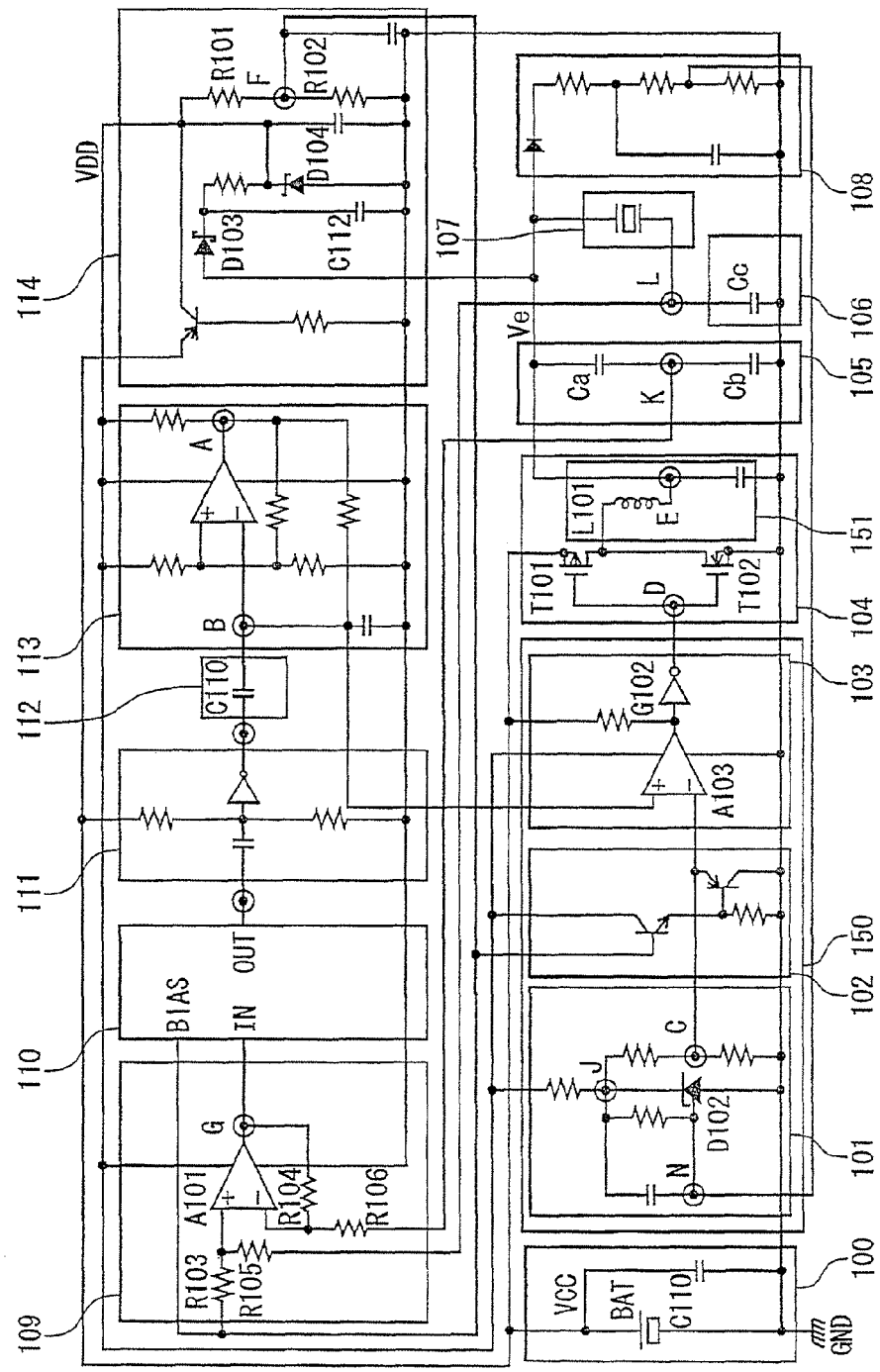
FIG. 1 illustrates a circuit of a first embodiment.
Figure 2:
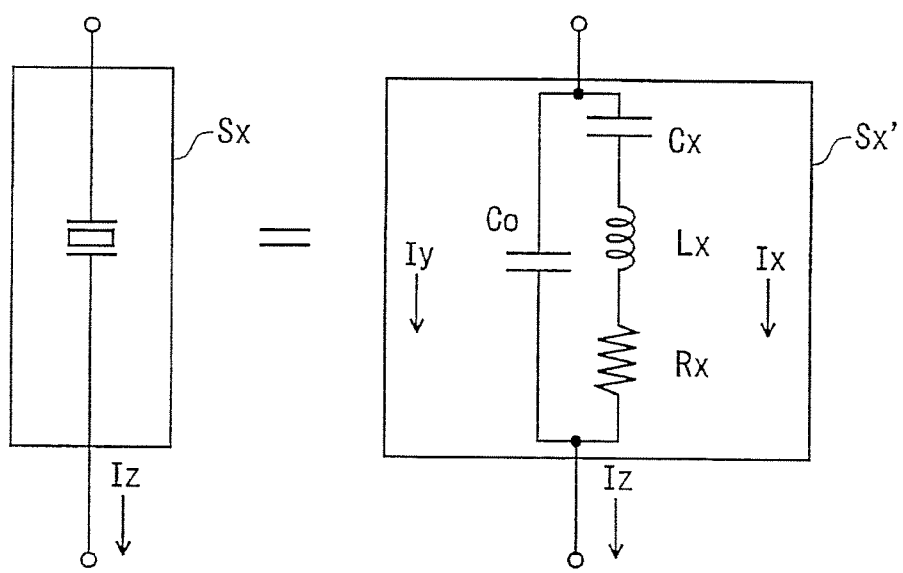
FIG. 2 illustrates an equivalent circuit of a piezoelectric vibrator.

FIG. 1 illustrates a circuit of a first embodiment. In FIG. 1, a main power supply 100 is configured by, for example, a battery in the case of a portable device, and outputs a voltage VCC.

An oscillation circuit section 113 generates a rectangular wave at a duty ratio of 50% at a point A, and generates a triangular wave at a point B. In the embodiment, an output of the oscillation circuit section 113 is derived at the point B.

A PWM comparator 103 includes a differential amplifier A103. In the differential amplifier A103, a positive input terminal is connected to the point B of the oscillation circuit section 113, and a negative input terminal is connected to a point C serving as an output terminal of an error voltage amplifier 101. A low voltage is outputted from an output terminal of the differential amplifier A103 only during a period in which a voltage of the point B is below a voltage of the point C, and a high voltage is outputted from the output terminal of the differential amplifier A103 during the other period. The output from the differential amplifier A103 is inverted by an inverter G102 and supplied to a point D serving as an input terminal of an output driver 104.

In the embodiment the output driver 104 includes: an inverter formed by a F-channel MOS transistor T101 and an N-channel MOS transistor T102; and a tuning booster 151 formed by a series circuit of an inductor L101 and a capacitor C105, which is connected to an output terminal of this inverter. An output of the PWM comparator 103 is supplied to the point D serving as an input terminal of the inverter. Thus, a high voltage driving pulse is applied to the point D only during the period in which the voltage of the point B is below the voltage of the point C. This period will be referred to as a "driving pulse width". A boosted sinusoidal wave driving voltage Ve, whose magnitude is responsive to the driving pulse width, is generated at a connection point E between the inductor L101 and the capacitor C105 and is supplied to a piezoelectric vibrator 107.

A resonance frequency of the series circuit of the inductor L101 and the capacitor C105 is set so as to be approximately equal to a resonance frequency fx of the piezoelectric vibrator 107. The series circuit of the inductor L101 and the capacitor C105 forms the tuning booster 151.

The tuning booster 151 is not an essential component in the embodiment, but the tuning booster 151 considerably enhances boosting performance. Furthermore, the tuning booster 151 not only simply enhances boosting performance but also achieves the following advantages. The tuning booster 151 is capable of applying a well-shaped low-distortion sinusoidal wave voltage to the piezoelectric vibrator 107, and efficiently driving the piezoelectric vibrator 107 without generating any redundant harmonic component, so that a phase of a current waveform is accurately detected.

In a damping current phase detector 105, the driving voltage Ve generated at the point E is divided at a point K by capacitors Ca and Cb, and is supplied as a damping current phase signal to a series resonance current calculator 109.

In a driving current phase detector 106, one terminal of a capacitor Cc is grounded, and the other terminal of the capacitor Cc is connected to one terminal of the piezoelectric vibrator 107 via a point L. The driving voltage Ve is applied to the other terminal of the piezoelectric vibrator 107 from the point E. At the paint L, a phase signal of a driving current flowing through the entire piezoelectric vibrator 107 appears, and this signal is supplied to the series resonance current calculator 109.

Relationships among the capacitors Ca and Cb of the damping current phase detector 105, the capacitor Cc of the driving current phase detector 106, and a damping capacitor Co of the piezoelectric vibrator 107 are set so that Ca/Co=Cb/Cc (where Ca, Cb, Cc and Co denote values of the capacitors Ca, Cb, Cc and Co, respectively).

In the series resonance current calculator 109, the damping current phase signal provided from the damping current phase detector 105 is supplied to a negative input terminal of a differential amplifier A101 via a resistor R106, and the driving current phase signal provided from the driving current phase detector 106 is supplied to a positive input terminal of the differential amplifier A101 via a resistor R105. The positive input terminal of the differential amplifier A101 is further biased to a voltage of a point F of a constant voltage power supply via a resistor R103, and the negative input terminal of the differential amplifier A101 is connected to an output terminal G of the differential amplifier A101 via a resistor R104.

Thus, the series resonance current calculator 109 outputs a signal of a waveform which is similar to that of the series resonance current Ix but is delayed by 90 degrees.

Figure 4A:
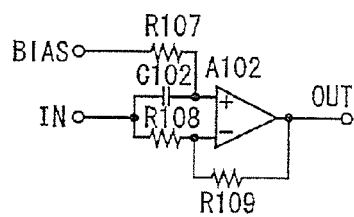
FIGS. 4A and 4B each illustrates an example of a phase shift circuit.
Figure 4B:
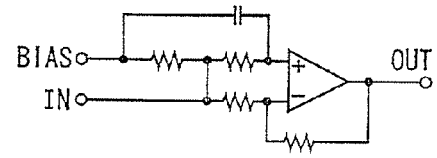
Figure 5A:
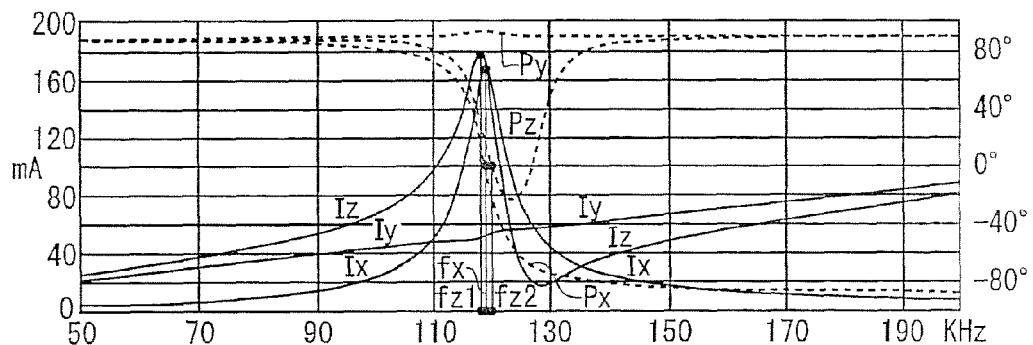
FIGS. 5A to 5C illustrate frequency characteristics of the piezoelectric vibrator.
Figure 5B:
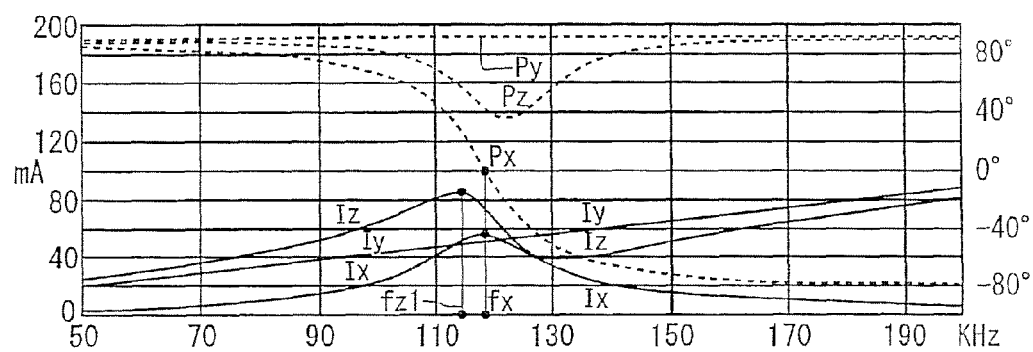
Figure 5C:
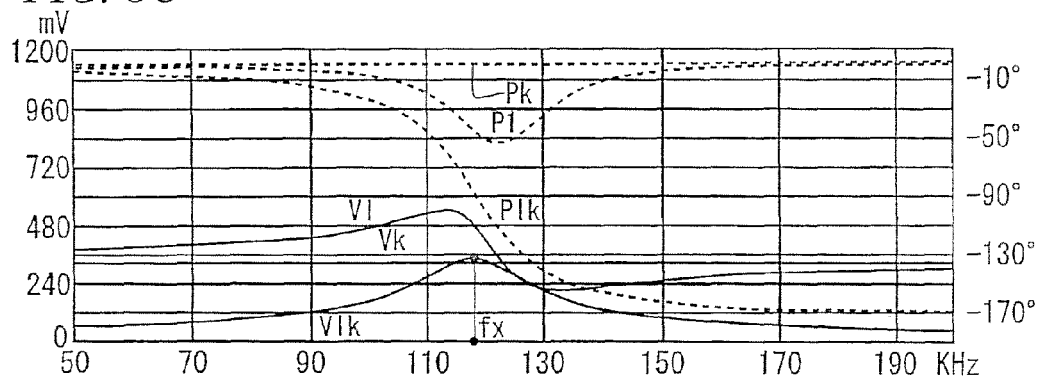

A phase shift circuit section 110 adjusts a phase of an output signal from the series resonance current calculator 109. Specific examples of phase shift circuits are illustrated in FIGS. 4A and 4B. FIG. 4A illustrates a leading phase shift circuit, and FIG. 4B illustrates a lagging phase shift circuit.

In the phase shift circuit section 110, leading phase or lagging phase is appropriately adopted in consideration of phase inversion in a waveform shaper 111, delay in other circuit constituent elements and characteristic of each constituent element, and a phase difference between the series resonance current Ix and the driving voltage Ve is adjusted so that the phase difference becomes approximately 0.

The waveform shaper 111 shapes an output waveform of the phase shift circuit section 110 into a rectangular wave, and rising and falling edge signals of the rectangular wave are supplied to the point B of the oscillation circuit section 113 through a differentiation circuit section 112. The oscillation circuit section 113 is triggered by the rising or falling edge signal and is synchronized with an output frequency of the series resonance current calculator 109. Accordingly, the differentiation circuit section 112 serves as a synchronization section.

In this embodiment, the error voltage amplifier 101 is configured by a shunt regulator D102, while it is common to use a differential amplifier. An anode of the shunt regulator D102 is grounded, a cathode of the shunt regulator D102 is connected to a point J, a REF terminal of the shunt regulator D102 is connected to a point N, and the point N is connected to an output terminal of a driving voltage detector 108. The driving voltage detector 108 rectifies the driving voltage Ve applied to the piezoelectric vibrator 107, and outputs a DC level signal proportional to the amplitude of the driving voltage Ve.

When a voltage of the REF terminal, determined using the anode as the reference, exceeds a constant reference voltage, the anode and the cathode of the shunt regulator D102 is brought into a shunt state. Accordingly, when the driving voltage Ve of the piezoelectric vibrator 107 is increased and a voltage of the point N exceeds the constant reference voltage, a voltage of the point J is rapidly decreased, and therefore, the voltage of the point C, obtained by dividing the voltage of the point J, is also decreased.

As mentioned above, the magnitude of the driving voltage Ve of the piezoelectric vibrator 107 is dependent on the driving pulse width, and the driving pulse width is the period during which the voltage of the point B is below the voltage of the point C. Hence, when the voltage of the point C is decreased, the driving pulse width will be reduced, and the magnitude of the driving voltage Ve will eventually be reduced.

To the contrary, when the driving voltage Ve of the piezoelectric vibrator 107 is decreased and the voltage of the point N falls below the constant reference voltage, the voltage of the point J is rapidly increased, and therefore, the voltage of the point C is increased; hence, the driving pulse width is increased, and the amplitude of the driving voltage Ve is increased. That is, by appropriately setting circuit constants of the error voltage amplifier 101 and the driving voltage detector 108, the amplitude of the driving voltage Ve applied to the piezoelectric vibrator 107 can be kept constant at all times.

A PWM maximum modulation setting section 102 imposes a limitation on an increase in the voltage of the point C. For example, as a result of setting the circuit constants of the error voltage amplifier 101 and the driving voltage detector, the voltage of the point C may be excessively increased and the width of pulse outputted from the PWM comparator 103 may exceed an allowable range. Thus, in the embodiment, the limitation is imposed on the increase in the voltage of the point C so that the voltage of the point C does not exceed (½) of VDD.

In this embodiment, the error voltage amplifier 101, the PWM maximum modulation setting section 102 and the PWM comparator 103 form a driving pulse generator 150.

The driving voltage Ve for driving the piezoelectric vibrator 107 is also supplied to the constant voltage power supply 114, and is rectified by a Schottky diode D103 and a capacitor C112 and further converted into a constant voltage by a Zener diode D104. The output VDD of the constant voltage power supply 114 is supplied as power to circuit elements, for which precision is particularly required, except for the output driver 104. The output VDD is divided by a resistor R101 and a resistor R102. Resistances of the two resistors are set at the same value. Thus, in the embodiment of FIG. 1, a voltage of (½)*VDD is generated at the point F, and is supplied as a bias voltage to the series resonance current calculator 109 and the PWM maximum modulation setting section 102.

Figure 3:
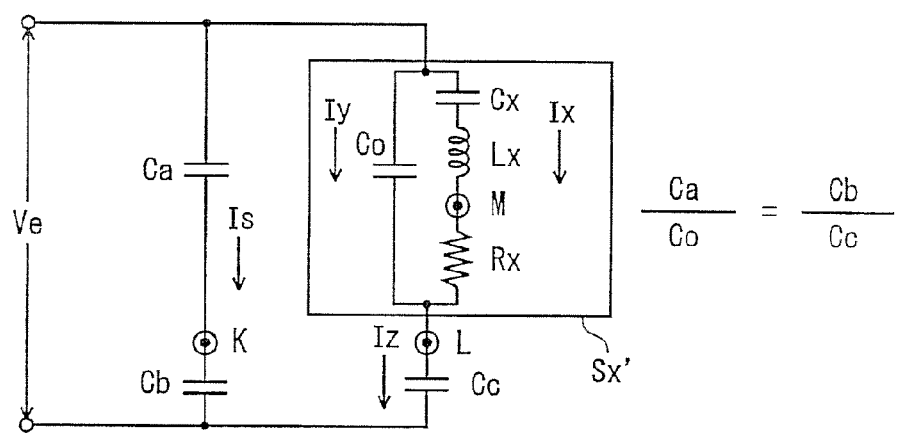
FIG. 3 illustrates a simulation circuit of the piezoelectric vibrator.

Circuit simulation results obtained when the value of the equivalent resistor is high for the first embodiment are illustrated in FIGS. 6A to 6E. Except for Ix, Iy and Iz, alphabetical symbols in these diagrams represent the voltages of the respective points corresponding to those illustrated in FIG. 1. M represents a voltage of a point M illustrated in FIG. 3. In the equivalent circuit Sx' of the piezoelectric vibrator illustrated in FIG. 3, Iy represents a damping current flowing through the damping capacitor Co, Ix represents a series resonance current flowing through a series circuit of Cx, Lx and Rx in FIG. 3, and Iz represents a driving current flowing through the entire piezoelectric vibrator via the capacitor Cc.

Figure 6A:
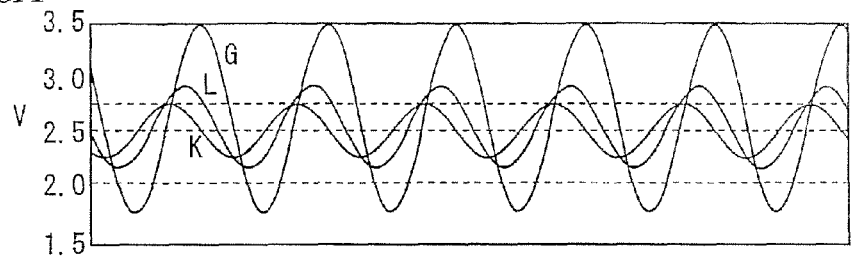
FIGS. 6A to 6E illustrate respective waveforms in the first embodiment.
Figure 6B:
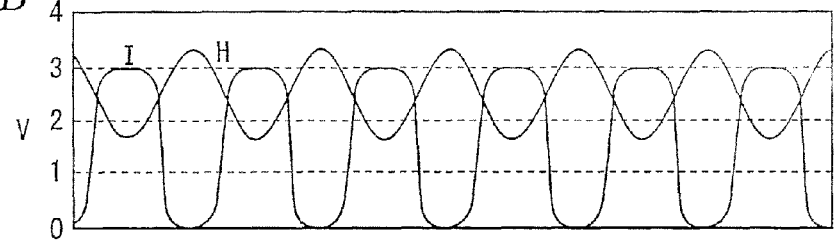
Figure 6C:
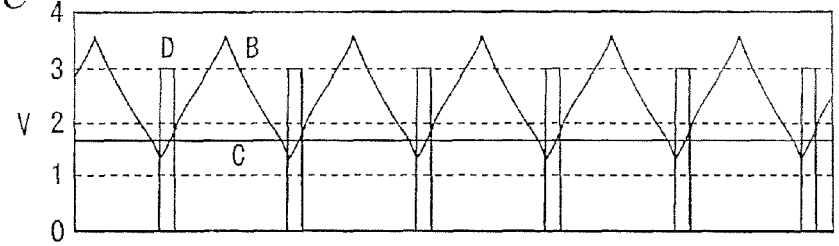
Figure 6D:
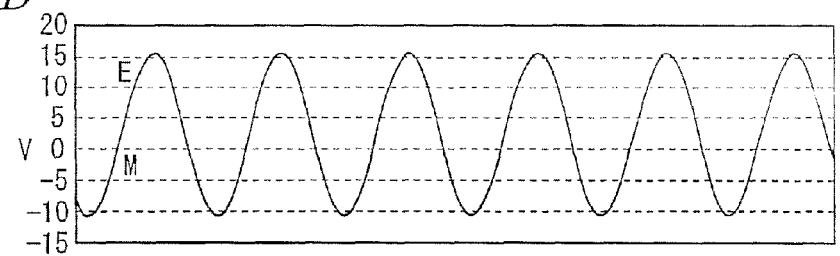
Figure 6E:
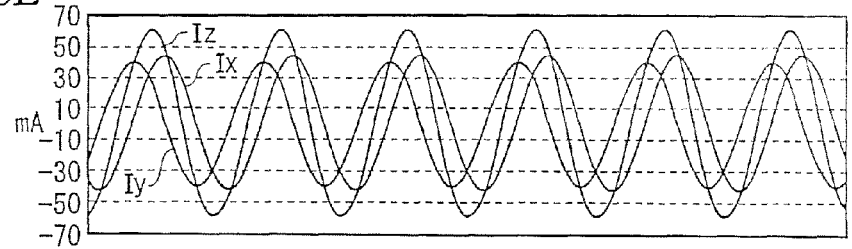

FIG. 6A illustrates waveforms obtained when the phase shift circuit section 110 performs adjustment so that a phase difference between the driving voltage Ve (E) of the piezoelectric vibrator 107 and the series resonance current Ix becomes approximately 0, i.e., so that the phase of the output signal from the series resonance current calculator 109 is substantially delayed by 90 degrees with respect to the driving voltage Ve (E), in the embodiment of FIG. 1.

Figure 7:
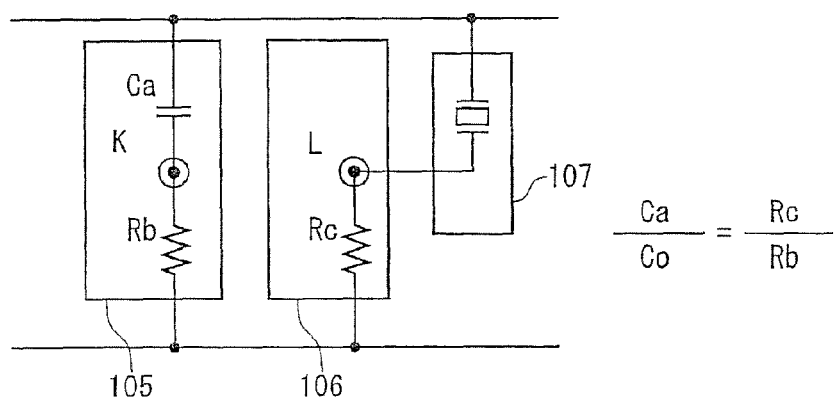
FIG. 7 illustrates another example of a current phase detector.

In this embodiment, the capacitors Ca and Cb are used for the damping current phase detector 105 and the capacitor Cc is used for the driving current phase detector 106, but resistors Rb and Re by which (Ca/Co=(Rc/Rb) may be used instead of the capacitors Cb and Cc, respectively, as illustrated in FIG. 7. In that case, since the phase of the output signal from the series resonance current calculator 109 is basically the same as that of the series resonance current Ix, the phase shift circuit section 110 performs the adjustment in accordance with that fact. Moreover, when the value of the inserted resistor Re is increased, a peak current of the series resonance current Ix will be limited. In view of such effect, the configuration using the capacitor Cc may be preferable.

Figure 8A:
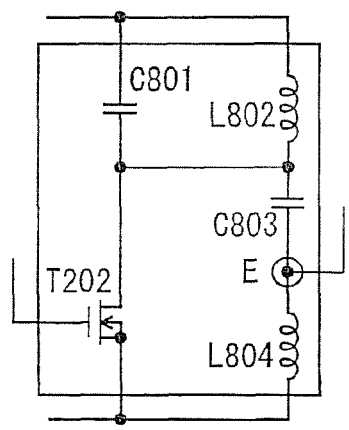
FIGS. 8A and 8B each illustrates another example of an output driver.
Figure 8B:
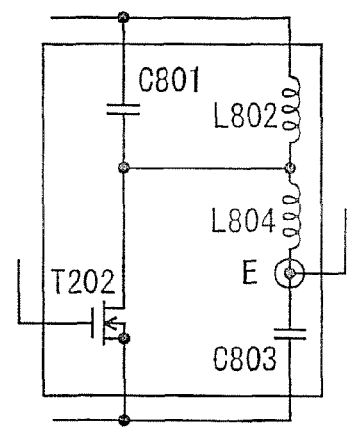

The output driver 104 may be configured as illustrated in FIG. 8A or 8B. In the configuration of each of FIGS. 8A and 8B, a resonance frequency of a parallel circuit of a capacitor C801 and an inductor L802 and a resonance frequency of a series circuit of a capacitor C803 and an inductor L804 are each set so as to be approximately equal to the resonance frequency fx of the piezoelectric vibrator 107. Although MOS transistors are exemplified as components of the output driver 104 in the first embodiment or the output driver 104 in the variation of FIGS. 8A and 813, bipolar transistors may be used. For example, in each of FIGS. 8A and 8B, a transistor T202 may be a bipolar transistor. And, for example, the inverter in FIG. 1 which is formed by the MOS transistors T101 and T102 may be changed into a hybrid inverter in which a bipolar transistor is used at the last stage.

Figure 9:
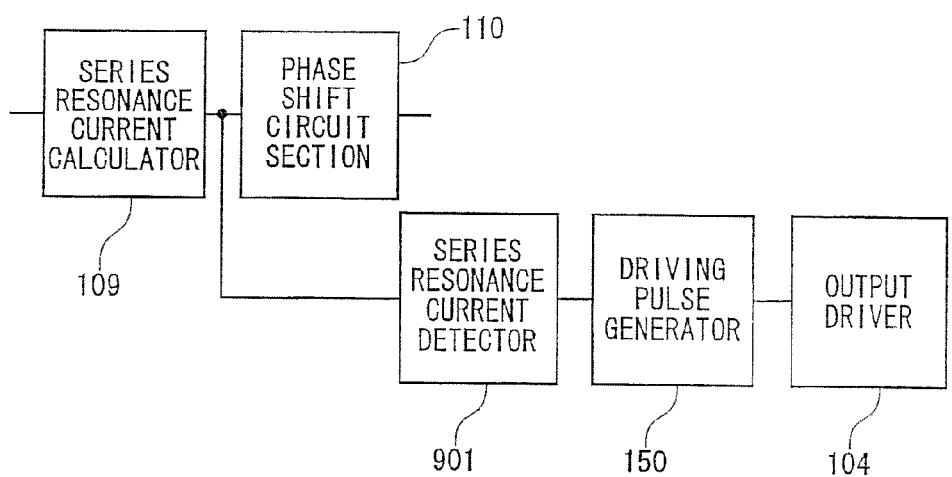
FIG. 9 illustrates another example of a driving pulse modulation.

In the embodiment, the driving pulse width is controlled so that the driving voltage becomes constant. Alternatively, as illustrated in FIG. 9 the output amplitude of the series resonance current calculator 109 may be amplified as necessary and supplied to a series resonance current detector 901 for rectification. In that case, a DC level signal proportional to the magnitude of the series resonance current Ix is obtained; therefore, when this signal is supplied to the driving pulse generator 150 instead of the output of the driving voltage detector 108, the control can be performed so that the magnitude of the series resonance current Ix is kept constant at all times.

In this embodiment, the phase shift circuit section 110 is provided so as to be immediately subsequent to the series resonance current calculator 109, but the phase shift circuit section 110 may be provided at any position as long as the phase difference between the series resonance current Ix and the driving voltage can eventually be brought to 0.

For example, the phase shift circuit section 110 may be provided between the driving pulse generator 150 and the output driver 104. Further, the configuration of the phase shift circuit section 110 is not limited to the ones illustrated in FIGS. 4A and 4B. For example, a digital phase shifter may be used depending on its installation position. Furthermore, the oscillation circuit section 113 may generate a sawtooth wave instead of a triangular wave.

When the load change is small, a change in a phase difference Pxy between the driving current Iz and the series resonance current Ix is considerably reduced; hence, only the driving current Iz may be detected without use of the series resonance current calculator 109, and settings may be made so that phase lock is achieved in a state where the phase difference between the driving current Iz and the driving voltage Ve is not brought to 0 but a deviation of the conceivable phase difference Pxy occurs, i.e., at a frequency higher than a frequency at which the driving current is maximized. Also in that case, the configurations of the output driver 104 and the driving pulse generator 150 are effective.

Second Embodiment

Figure 10:
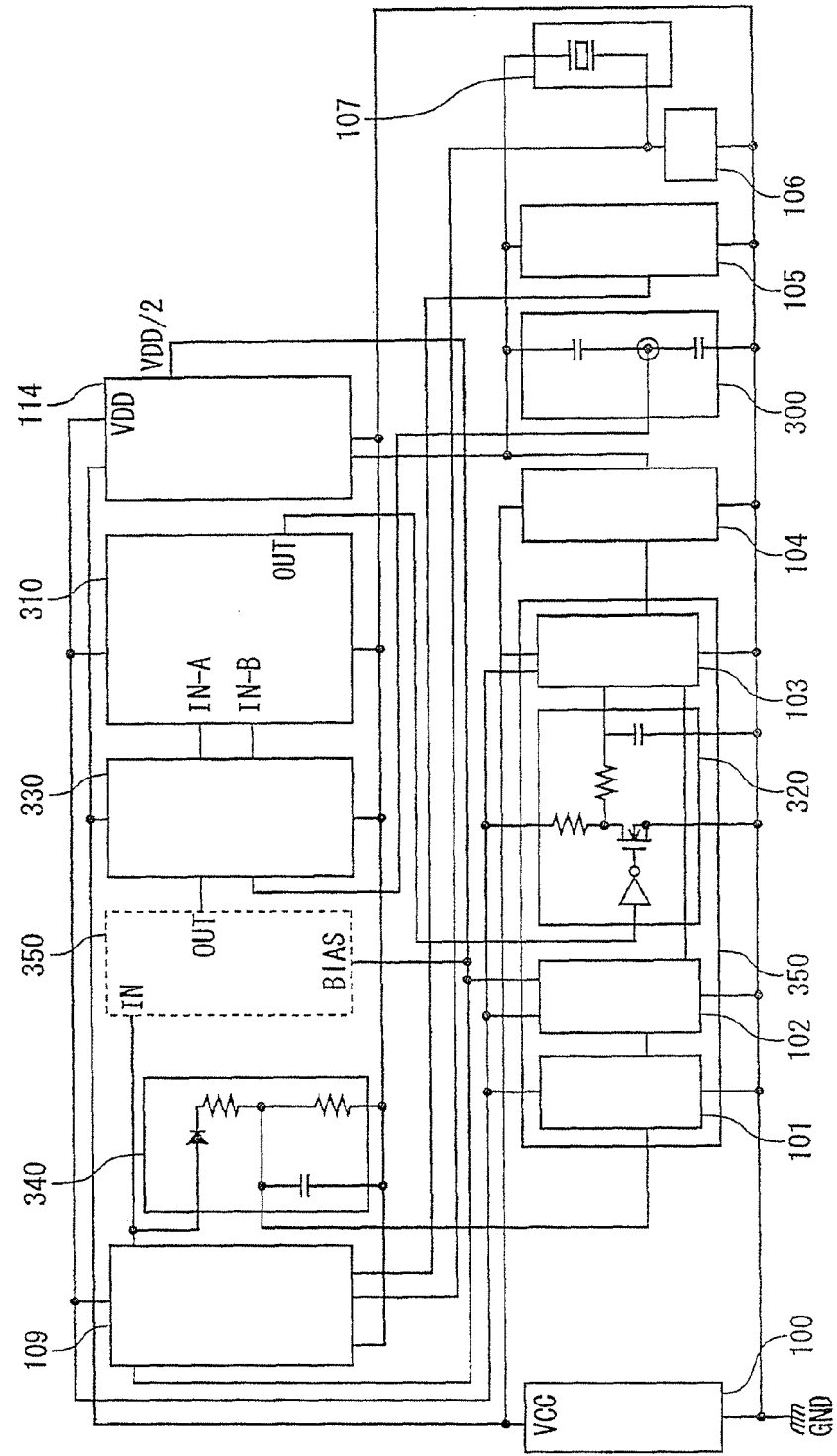
FIG. 10 illustrates a circuit of a second embodiment.

FIG. 10 illustrates a circuit of a second embodiment. In this embodiment, a PLL circuit section 310 is utilized. The PLL circuit section 310 incorporates a VCO (voltage controlled oscillator) and a phase comparator, and has two phase comparison input terminals IN-A and IN-B. The PLL circuit section 310 enables control of oscillation frequency and oscillation phase of the VCO such that a phase difference between two signals inputted to the input terminals IN-A and INB becomes 0.

For example, when the waveforms of the driving voltage Ve applied to the piezoelectric vibrator 107 and the series resonance current Ix are allowed to be inputted to the two phase comparison input terminals, the phase of the series resonance current Ix and that of the driving voltage Ve will coincide with each other due to the function of the PLL circuit section 310. In this embodiment, a driving voltage phase detector 300 for simply capacitively dividing the driving voltage is provided in order to detect the waveform of the driving voltage. Alternatively, the driving current phase detector may also be used for detecting the waveform of the driving voltage.

The damping current phase detector 105 and the driving current phase detector 106 in FIG. 10 have configurations similar to those illustrated in FIG. 1. In this case, since the output of the series resonance current calculator 109 is delayed by 90 degrees with respect to the actual series resonance current Ix as mentioned above, the output of the series resonance current calculator 109 is advanced by 90 degrees by using the phase shift circuit section 350 so as to make a phase comparison with the driving voltage Ve. Thus, the PLL circuit section 310 controls the frequency and oscillation phase of the VCO so that the phase difference between the driving voltage Ve and the resonance current Ix becomes 0.

Since the signals inputted to the input terminals of the PLL circuit section 310 are required to be digital signals, an output of the phase shift circuit section 350 and a signal from the driving voltage phase detector 300 are each shaped by a waveform shaper 330.

In second embodiment, since the oscillation circuit section 113 is omitted unlike to the first embodiment, triangular wave voltage waveform to be applied to the PWM comparator is not obtainable therefrom. Accordingly, in the second embodiment, as a substitute for the oscillation circuit section 113, a PWM triangular wave generator 320 for outputting a triangular wave in synchronization with a VCO output of the PLL circuit section 310 is provided. A sawtooth wave generator may be used instead of the PWM triangular wave generator 320.

In this embodiment, the phase shift circuit section 350 is provided immediately subsequent to the series resonance current calculator 109, and a phase comparison is made between an output signal from the phase shift circuit section 350 and an output signal from the driving voltage phase detector 300 by the PLL circuit section 310. However, the phase shift circuit section 350 may be provided at any position as long as the phase difference between the series resonance current Ix and the driving voltage can eventually be brought to 0.

For example, instead of delaying the output signal from the series resonance current calculator 109, the output signal from the driving voltage phase detector 300 may be advanced. Alternatively, a phase comparison may be directly made between the output signal from the driving voltage phase detector 300 and the output signal from the series resonance current calculator 109 by the PLL circuit section 310 after each of the output signals has been subjected to waveform shaping. In that case, since the phase of the VCO output is delayed by 90 degrees compared with the first embodiment, the phase shift circuit section 350 may be inserted into any of signal paths between the output terminal of the PLL circuit section 310 and the input terminal of the output driver 104 to advance the signal phase by 90 degrees.

In this embodiment, the damping current phase detector 105 and the driving current phase detector 106 have the configurations similar to those illustrated in FIG. 1, but the configurations illustrated in FIG. 7 may alternatively be used. In that case, since the phase of the output signal from the series resonance current calculator 109 will be the same as that of the series resonance current Ix, the phase shift circuit section 350 is basically unnecessary; however, the inserted resistor Re will limit the peak current of the series resonance current Ix as mentioned above, and therefore, the configuration using the capacitor Cc may be preferable.

In this embodiment, an example in which the foregoing series resonance current Ix is kept constant is described. The output from the series resonance current calculator 109 is rectified and converted into a DC level signal by a series resonance current detector 340. The level signal is sent to the PWM comparator 103 via the error voltage amplifier 101. Thus, the series resonance current Ix is kept constant. As necessary, the output from the series resonance current calculator 109 may be amplified and then rectified. A control method for keeping the driving voltage Ve constant may be adopted similarly to the first embodiment.

In this embodiment, the phase of the output from the damping current phase detector 105 is the same as that of the driving voltage Ve; therefore, the driving voltage phase detector 300 may be removed, and the output from the damping current phase detector 105 may alternatively be used.

The invention claimed is:

1. A piezoelectric vibrator driving circuit for driving a piezoelectric vibrator, the piezoelectric vibrator having an equivalent circuit in which an LC series resonance circuit formed by an equivalent capacitor Cx and an equivalent inductor Lx connected in series, an equivalent resistor Rx connected in series to the LC series resonance circuit and a damping capacitor Co connected in parallel to the LC series resonance circuit and the equivalent resistor Rx are provided, the driving circuit comprising:
   a self-excited oscillation type oscillation circuit section configured to oscillate, an oscillation frequency thereof being variable;
   a driving pulse generator configured to generate a driving pulse in synchronization with the oscillation frequency;
   art output driver configured to output a driving voltage Ve to be applied on the piezoelectric vibrator, based on the driving pulse;
   a driving current phase detector configured to detect a driving current Iz flowing through the entire piezoelectric vibrator;
   a damping current phase detector configured to detect a damping current Iy flowing through the damping capacitor Co;
   a series resonance current calculator configured to subtract the detected damping current Iy from the detected driving current Iz to thereby calculate a series resonance current Ix flowing through the LC series resonance circuit;
   a synchronization section configured to synchronize the oscillation frequency of the oscillation circuit section with a frequency of the calculated series resonance current Ix; and
   a phase shift circuit section inserted into any point of a signal path leading from an output terminal of the driving current phase detector or the damping current phase detector to an input terminal of the output driver, and configured to perform a phase adjustment so that a phase difference between the calculated series resonance current Ix and the driving voltage Ve becomes approximately 0.

2. The piezoelectric vibrator driving circuit of claim 1, wherein the oscillation circuit section is configured to generate a triangular wave or a sawtooth wave, and the driving pulse generator has a PWM comparator configured to control an output pulse width in accordance with a magnitude relationship between signals applied to its input terminals, and
wherein the triangular wave or sawtooth wave generated by the oscillation circuit section is applied to at least one of the input terminals of the PWM comparator, and a level signal, which corresponds to a vibration of the piezoelectric vibrator and is to be maintained constant, is applied to the other input terminal of the PWM comparator.

3. The piezoelectric vibrator driving circuit of claim 2, wherein the level signal is applied to the other input terminal of the PWM comparator via an error voltage amplifier.

4. The piezoelectric vibrator driving circuit of claim 1, wherein the driving current phase detector includes a capacitor Cc connected in series to the piezoelectric vibrator,
wherein the damping current phase detector includes a series circuit of a capacitor Ca one end of which is connected to the piezoelectric vibrator and a capacitor Cb one end of which is connected to the capacitor Cc, and
wherein a capacity ratio Ca/Co between the capacitor Ca and the damping capacitor Co is approximately equal to a capacity ratio Cb/Cc between the capacitor Cb and the capacitor Cc.

5. The piezoelectric vibrator driving circuit of claim 1, wherein the driving current phase detector includes a resistor Rc connected in series to the piezoelectric vibrator,
wherein the damping current phase detector includes a series circuit of a capacitor Ca one end of which is connected to the piezoelectric vibrator and a resistor Rb one end of which is connected to the resistor Rc, and
wherein a capacity ratio Ca/Co between the capacitor Ca and the damping capacitor Co is approximately equal to a resistance ratio Rc/Rb between the resistor Rc and the resistor Rb.

6. The piezoelectric vibrator driving circuit of claim 1, wherein the output driver includes:
   an inverter formed by complementary transistors; and
   a series circuit of an inductor one end of which is connected to an output terminal of the inverter and a capacitor one end of which is connected to a power supply, wherein a resonance frequency of the series circuit of the inductor and the capacitor is set so as to be approximately equal to a resonance frequency fx of the piezoelectric vibrator, and wherein a connection point between the inductor and the capacitor serves as an output terminal.

7. The piezoelectric vibrator driving circuit of claim 1, wherein the output driver includes:
  a parallel circuit of a first inductor and a first capacitor, one terminal of which is connected to a power supply and the other terminal of which is connected to a drain of a MOS transistor or a collector of a bipolar transistor; and
  a series circuit of a second inductor and a second capacitor, one terminal of which is connected to the drain or collector and the other terminal of which is grounded together with a source of the MOS transistor or an emitter of the bipolar transistor,
  wherein a resonance frequency of the parallel circuit of the first inductor and the first capacitor and a resonance frequency of the series circuit of the second inductor and the second capacitor are each set so as to be approximately equal to a resonance frequency fx of the piezoelectric vibrator, and
  wherein a connection point between the second inductor and the second capacitor serves as an output terminal.

8. The piezoelectric vibrator driving circuit of claim 1, further comprising:
  the piezoelectric vibrator.

9. A piezoelectric vibrator driving circuit for driving a piezoelectric vibrator, the piezoelectric vibrator having an equivalent circuit in which an LC series resonance circuit formed by an equivalent capacitor Cx and an equivalent inductor Lx connected in series, an equivalent resistor Rx connected in series to the LC series resonance circuit and a damping capacitor Co connected in parallel to the LC series resonance circuit and the equivalent resistor Rx are provided, the driving circuit comprising:
  a PLL circuit section having a phase comparator and a VCO;
  a driving pulse generator configured to generate a driving pulse based on an output of the PLL circuit section;
  an output driver configured to output a driving voltage Ve to be applied on the piezoelectric vibrator, based on the driving pulse;
  a driving current phase detector configured to detect a driving current Iz flowing through the entire piezoelectric vibrator;
  a damping current phase detector configured to detect a damping current Iy flowing through the damping capacitor Co;
  a series resonance current calculator configured to subtract the detected clamping current Iy from the detected driving current Iz to thereby calculate a series resonance current Ix flowing through the LC series resonance circuit; and
  a driving voltage phase detector configured to detect the driving voltage Ve applied to the piezoelectric vibrator,
  wherein the phase comparator of the PLL circuit section includes one input terminal to which an output of the series resonance current calculator is input and the other input terminal to which an output of the driving voltage phase detector is input, and the PLL circuit section performs a phase adjustment so that a phase difference between inputs to the both input terminals becomes approximately 0.

10. A piezoelectric vibrator driving circuit for driving a piezoelectric vibrator, the piezoelectric vibrator having an equivalent circuit in which an LC series resonance circuit formed by an equivalent capacitor Cx and an equivalent inductor Lx connected in series, an equivalent resistor Rx connected in series to the LC series resonance circuit and a damping capacitor Co connected in parallel to the LC series resonance circuit and the equivalent resistor Rx are provided, the driving circuit comprising:
  a self-excited oscillation type oscillation circuit section configured to oscillate, illation frequency thereof being variable;
  a driving pulse generator configured to generate a driving pulse in synchronization with the oscillation frequency;
  an output driver configured to output a driving voltage Ve to be applied on the piezoelectric vibrator, based on the driving pulse;
  a driving current phase detector configured to detect a driving current Iz flowing through the entire piezoelectric vibrator;
  a damping current phase detector configured to detect a damping current Iy flowing through the damping capacitor Co; and
  a series resonance current calculator configured to subtract the detected damping current Iy from the detected driving current Iz to thereby calculate a series resonance current Ix flowing though the LC series resonance circuit,
  wherein an output of the driving current phase detector or the series resonance current calculator is fed back to the oscillation circuit section, and a phase adjustment is performed so that a phase difference between the output of the driving current phase detector or the series resonance current calculator and the driving voltage Ve becomes approximately 0, and
  wherein there is further provided a series resonance current detector configured to detect an amplitude of the output of the series resonance current calculator, and a width of the driving pulse is controlled so that an output of the series resonance current detector becomes constant.

11. A piezoelectric vibrator driving circuit for driving a piezoelectric vibrator, the piezoelectric vibrator having an equivalent circuit in which an LC series resonance circuit formed by an equivalent capacitor Cx and an equivalent inductor Lx connected in series, an equivalent resistor Rx connected in series to the LC series resonance circuit and a damping capacitor Co connected in parallel to the LC series resonance circuit and the equivalent resistor Rx are provided, the driving circuit comprising:
  a self-excited oscillation type oscillation circuit section configured to oscillate, an oscillation frequency thereof being variable;
  a driving pulse generator configured to generate a driving pulse in synchronization with the oscillation frequency;
  an output driver configured to output a driving voltage Ve to be applied on the piezoelectric vibrator, based on the driving pulse;
  a driving current phase detector configured to detect a driving current Iz flowing through the entire piezoelectric vibrator,
  wherein an output of the driving current phase detector is fed back to the oscillation circuit section, and the oscillation frequency of the oscillation circuit section is synchronized with a vibration frequency of the piezoelectric vibrator, and
  wherein there is further provided a phase shift circuit section inserted into any point of a signal path leading from an output terminal of the driving current phase detector to an input terminal of the output driver, and configured to perform a phase adjustment so that a phase difference between the detected driving current Iz or a calculated series resonance current Ix flowing through the LC series resonance circuit and the driving voltage Ve becomes approximately 0.

* * * * *